(12) United States Patent
Zhang et al.

(10) Patent No.: US 8,324,622 B2
(45) Date of Patent: Dec. 4, 2012

(54) METHOD OF REPAIRING PROBE PADS

(75) Inventors: John H. Zhang, Fishkill, NY (US);
Laertis Economikos, Wappingers Falls, NY (US); Robin Van Den Nieuwenhuizen, Ridgefield, CT (US); Wei-Tsu Tseng, Hopewell Junction, NY (US)

(73) Assignees: STMicroelectronics Inc., Coppell, TX (US); International Business Machines Corporation, Armonk, NY (US)

( * ) Notice: Subject to any disclaimer, the term of this patent is extended or adjusted under 35 U.S.C. 154(b) by 145 days.

(21) Appl. No.: 12/651,332

(22) Filed: Dec. 31, 2009

(65) Prior Publication Data

US 2011/0156032 A1   Jun. 30, 2011

(51) Int. Cl.
*H01L 23/58* (2006.01)
*H01L 29/10* (2006.01)
(52) U.S. Cl. .................... 257/48; 257/E21.59; 438/17
(58) Field of Classification Search ............... 257/E21.59
See application file for complete search history.

(56) References Cited

U.S. PATENT DOCUMENTS

| 6,323,048 B1 | 11/2001 | Chevallier | |
|---|---|---|---|
| 2002/0135055 A1* | 9/2002 | Cho et al. | 257/678 |
| 2005/0060681 A1* | 3/2005 | Robson et al. | 716/21 |
| 2007/0013071 A1* | 1/2007 | Adkisson et al. | 257/758 |
| 2007/0290204 A1* | 12/2007 | Jao et al. | 257/48 |

* cited by examiner

*Primary Examiner* — Daniel Whalen
(74) *Attorney, Agent, or Firm* — Seed IP Law Group PLLC (57) ABSTRACT

A method that includes forming a first level of active circuitry on a substrate, forming a first probe pad electrically connected to the first level of active circuitry where the first probe pad having a first surface, contacting the first probe pad with a probe tip that displaces a portion of the first probe pad above the first surface, and performing a chemical mechanical polish on the first probe pad to planarize the portion of the first probe pad above the first surface. The method also includes forming a second level of active circuitry overlying the first probe pad, forming a second probe pad electrically connected to the second level of active circuitry, contacting the second probe pad with a probe tip that displaces a portion of the probe pad, and chemically mechanically polishing the second probe pad to remove the portion displaced.

12 Claims, 5 Drawing Sheets

METHOD OF REPAIRING PROBE PADS

BACKGROUND

1. Technical Field

The present disclosure relates to a method of repairing a probe pad, and more particularly, to chemically mechanically polishing a probe pad damaged by a probe tip prior to forming a subsequent layer.

2. Description of the Related Art

Integrated circuits are produced by forming a plurality of layers on a semiconductor wafer. A sequence of processes forms and shapes the layers to create features of the intended electronic device. Manufacturers use probe pads electrically connected to the integrated circuits at intermediate stages of the manufacturing process process in order to test the electrical properties of various components right after they are formed, before the integrated circuit is fully complete, and functionality of the integrated circuits.

These inline tests are used by chip manufacturers to detect potential wafer failures early so the manufacturer can stop work on that wafer in time to avoid a big loss. The inline tests are used at many stages of the manufacturing process to allow for faster detection, diagnosis, and correction of defective processes.

BRIEF SUMMARY

In accordance with an embodiment of the present disclosure, a wafer is chemically mechanically polished after each inline test to remove any material displaced by the probing processes and to repair the probe pad prior to depositing the next set of layers. For example, a method is provided that includes forming an electronic device on a substrate and forming a probe pad electrically connected to the electronic device. The probe pad is formed of a conductive material and has a top surface that is manufactured to be contacted by a probe tip from automated testing equipment. After the probe pad is formed, the automated testing equipment contacts the probe pad with the probe tip displacing a portion of the probe pad. The probe tip forms a scrub mark that includes forming a depression or hole in the probe pad and a protrusion of the probe pad material that extends from the top surface. The substrate, including the probe pad, is subjected to a chemical mechanical polish to planarize the portion of the probe pad that extends above the top surface.

Prior level probe pad damage can cause test failures at the next inline test level. The probe pad damage can also lead to problems that include under-etched vias and outgassing. Ambient air and moisture can enter the prior level through the damage caused by the probe tip. The inventors have realized that minimizing probe tip induced damage in the earlier stages of wafer processing plays an important role in the successful integration of electrical testing in the manufacturing process. Probe pads are electrically contacted by automatic testing equipment that pushes a probe card having a plurality of small conductive needles into the probe pads of the wafer. The probe tips damage the probe pads, forming scrub marks when the probe tips are pushed across the surface of the probe pad to ensure electrical communication. The scrub mark causes the surface of the probe pad to have peaks and valleys that impact the adhesion and reliability of subsequent layers, which lowers the yields per wafer. The problem realized by the inventors is avoided by carrying out the steps described herein.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Semiconductor devices are formed on a substrate, often a mono-crystalline silicon substrate that can be selectively doped by diffusing impurities into the silicon. The substrate may be doped to support formation of active regions or integrated circuits. Successive layers, such as insulative, conductive, or semiconductive layers are formed and shaped to produce the operational integrated circuit components. Manufacturers use a plurality of techniques to form and shape the layers including deposition, epitaxy, etching, and chemical mechanical polishing, to name a few.

During the manufacturing process a plurality of metal or conductive layers are formed to interconnect the components of the integrated circuit and to provide an external electrical connection to the device. Components of the integrated circuits are coupled together laterally across the wafer and vertically through the layers. The metal layers are formed at logical stopping points in the manufacturing process and are often referred to as metal one, metal two, and so forth. Probe pads may be formed at each of the metal layers to test the functionality of the integrated circuit at that stage of the manufacturing process.

The probe pads are a metal surface on the integrated circuit, such as aluminum or copper, where a test probe tip 101 or needle makes contact. Probe pads 102 are typically rectangular in shape, as small as 1 micron per side, but are typically 5-10 microns. The probe pads can be other shapes and can vary in size. The size of the probe pad may relate to a size of an opening 105 in a passivation layer 110 or a size of the metal surface of the probe pad.

Figure 1:
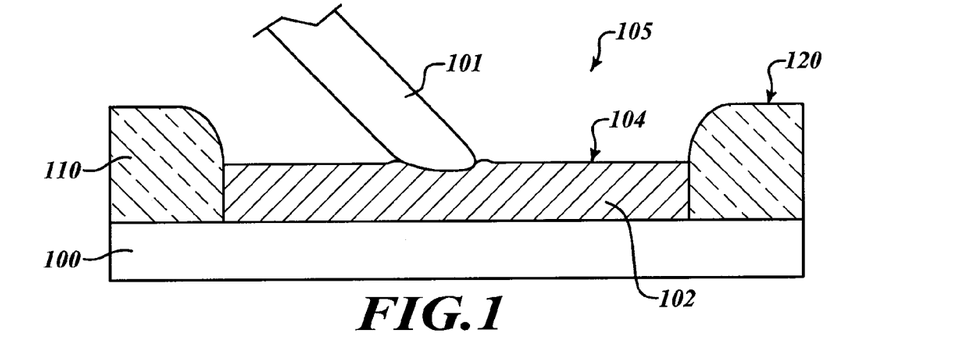
FIG. 1 is a cross-sectional view of a probe tip in contact with a probe pad.

FIG. 1 shows a cross-sectional view of the probe pad 102 formed on a wafer 100. The wafer 100 includes previously formed active circuitry 100a, such as transistors that are electrically coupled to a respective probe pad 102 in a plane not shown in this cross-section. The passivation layer 110 is formed overlying the wafer 100 and the probe pad 102. The passivation layer 110 may be an ultra-low k dielectric film formed from silicon, carbon, oxygen, and hydrogen. Other materials may be used for the passivation layer 110, such as a tetra ethyl ortho silicate (TEOS) layer formed by a hot mask. The opening 105 is formed through the passivation layer 110 to expose a surface 104 of the probe pad 102. The opening 105 in the passivation layer 110 can overlap edges of the probe pad 102, reducing the size by 10% or more.

Periodically, manufacturers perform inline tests using probe pads 102 formed at the different metal levels. The inline tests determine functionality, electrical properties of certain components, such as the polysilicon resistivity, or locate defects on each die of the wafer. Automatic testing equipment controls a probe card connected to a test head and a test head manipulator. The probe card has a plurality of small needles or probe tips 101 attached to the test head that make temporary electrical connections between testing equipment and the probe pads 102.

The probe tips 101 are typically formed from high-performance metals, like tungsten, that have good conductivity and strong mechanical properties. The usable lifetime of the probe card is measured in the number of "touchdowns," which is the number of times the tips 101 come into contact with the probe pads 102 on the wafer 100. Typically, each touchdown includes an overdrive that pushes and scrubs the probe tip 101 across the surface 104 of the probe pad 102 to ensure good electrical communication.

Overdrive relates to contact force or an amount of distance traveled after the initial touchdown of the probe tips. Proper overdrive ensures all of the probes tips are in contact with the probe pads of a die. Overdrive also provides the scrubbing action required to penetrate an oxide layer that may form on the probe pad, if the probe pad is aluminum.

Figure 2:
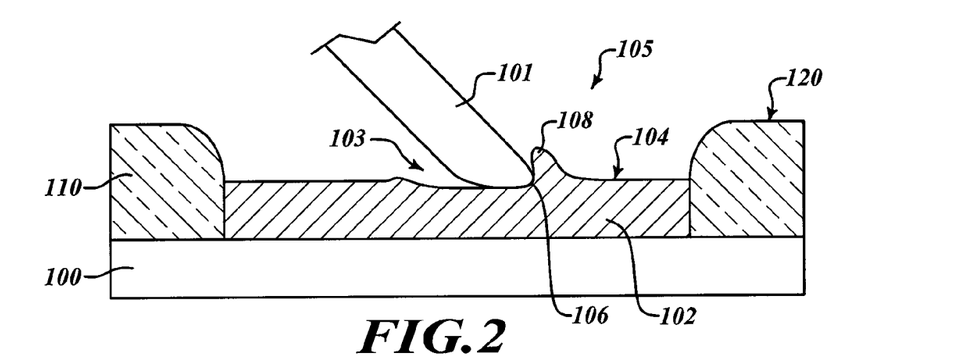
FIG. 2 is a cross-sectional view of the probe tip forming a scrub mark on the probe pad of FIG. 1.

In FIG. 2, the overdrive forms a scrub mark 103 having a divot 106 and an associated ridge 108 of the probe pad 102 material that is pushed up from the surface 104. The scrub mark 103 refers to a sliding of the probe tip 101 from the initial touchdown to where it rests after overdrive. After the tip 101 makes the initial contact with the probe pad in FIG. 1, the tip 101 may penetrate further and push the ridge 108 of material from the surface 104 of the probe pad 102 at the forward end of the scrub mark 103. As probe tips 101 become worn down from use, the size of the ridge 108 formed can increase.

Aligning the probe tip 101 within the opening 105 is a challenge on small probe pads 102. In some situations, the probe tip 101 is pushed up against or into the passivation layer 110, which can form a larger ridge than the ridge 108.

Testing of die prior to completion of a circuit and prior to packaging has increased recently due to the introduction of multiple or stacked die packages, use of new materials, and the abundance of new designs in advanced wafer processes. Each touchdown of the probe card damages the contacted probe pads 102. If the inline tests are performed at each metal layer prior to forming the subsequent layers, the damage to probe pads is compounded with each subsequent metal layer and test.

The scrub marks 103 and ridges 108 formed are unavoidable and cause probing induced failures, which result in lower yields per wafer. For example, a large deep scrub mark 103 can cause poor adhesion between wire bonds for connecting stacked die in a single package. The poor adhesion is a major factor in yield loss for these stacked die devices. In addition, low-k dielectrics, which can be softer and more brittle than conventional dielectrics, are easily damaged by the probe and overdrive.

Figure 3:
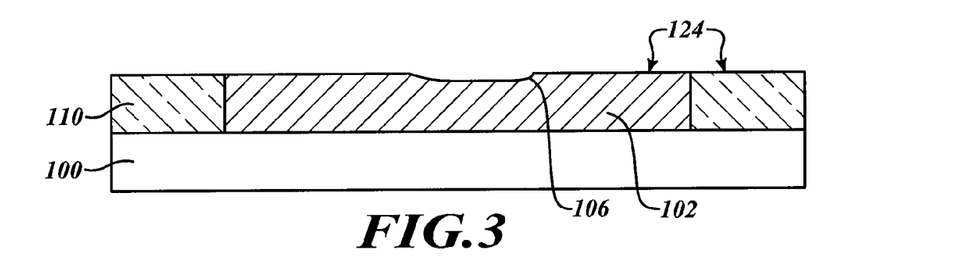
FIG. 3 is a cross-sectional view of the probe pad after a chemical mechanical polishing in accordance an embodiment of the present disclosure.

FIG. 3 is a cross-sectional view of the wafer 100 after a short chemical mechanical polishing (CMP) that removes the ridge 108 and a top portion of the passivation layer 110. CMP is a process that applies chemical and mechanical forces to a surface 120 of the wafer 100 to prepare a smooth surface 124 for further processing. Pressure is applied to a back of the wafer 100 in a CMP machine to bring the surface 120 of the wafer 100 into contact with a pad and slurry, which are selected to remove a specific film formed on the wafer 100.

Since the ridge 108 is a small feature, for example, only 0.5 microns in height, the length of time of the CMP will be short. In one embodiment, the wafer 102 is polished for approximately 10 seconds at a low pressure per square inch, such as 1.1 psi. Different lengths of time may be applied depending on the size of the ridge 108 and a thickness of the passivation layer 110.

The CMP pad and slurry combination can be configured to remove specific layers. For example, the CMP process may be directed to bulk copper removal, residual copper removal, or ultra-low k removal. In one embodiment, a residual copper removal CMP process for 10 seconds at 1.1 psi sufficiently planarizes the probe pad 102. Other CMP selections may be used to planarize the probe pad 102.

After the CMP, a portion of the divot 106 remains extending below the surface 124 of the probe pad 102. The divot 106 is very small such that surface tension will prevent moisture from getting trapped by subsequent layers. In addition, a post-CMP clean may flush out any particulates that may be trapped in the divot. In one embodiment, a thickness of the probe pad 102 may be increased during manufacturing to provide additional material that will be removed during the CMP so the entire divot 106 can be removed.

Figure 4:
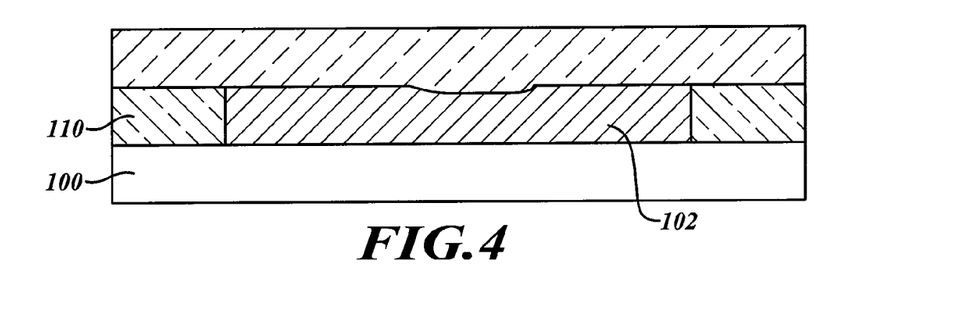
FIG. 4 is a cross-sectional view of the probe pad of FIG. 3 after deposition of a dielectric layer.

FIG. 4 is a cross-sectional view of a dielectric layer 126 formed overlying the repaired probe pad 102. The divot 106 is enlarged in the Figures for clarity. In practice, the divot 106 may be negligible such that the dielectric layer 126 evenly forms over the probe pad 102.

If the probe pad 102 is coupled to the first metal level, metal one, a plurality of layers will be deposited overlying the dielectric layer 126 to form additional components of the intended electronic device. In one embodiment, the probe pad 102 is formed overlying active circuitry of the electronic device. In an alternative embodiment, the probe pad 102 is formed in a kerf region between dice. If the probe pad 102 is formed in the final metal layer, the probe pad 102 may also be a bond pad for wire bonding or the electrical connection point for a stacked die package.

Figure 5:
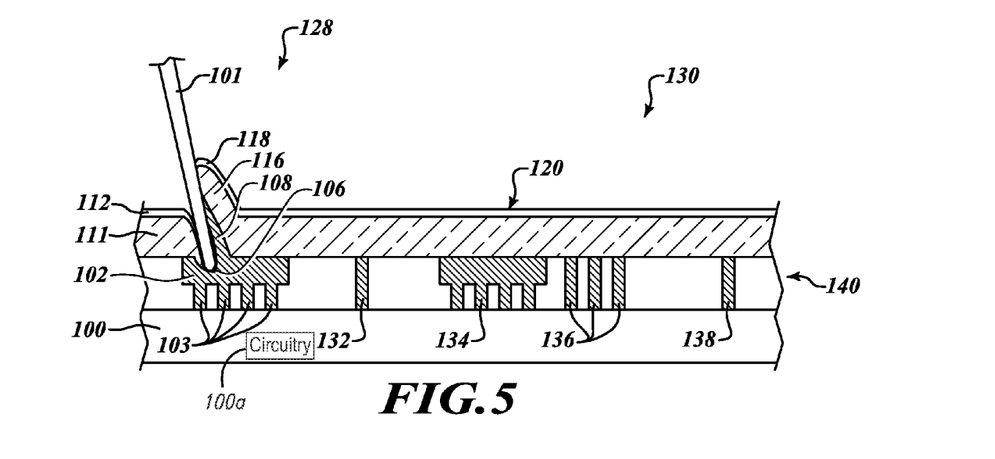
FIGS. 5-13 are cross-sectional views of various stages of a process of forming, testing, and repairing probe pads at different metal levels of a device.

FIGS. 5-13 are cross-sectional views of an alternative embodiment of a plurality of probe pads formed a different metal levels that are damaged by probe tips and repaired in accordance with a method of the present disclosure. FIG. 5 illustrates the probe pad 102 at a first metal layer 140 that has been damaged by the probe tip 101. In this embodiment, prior to testing, first and second inter layer dielectrics 111 and 112 are deposited overlying the probe pad 102 and the other components on the wafer 100. The first inter layer dielectric 111 may be an ultra-low k dielectric film formed from silicon, carbon, oxygen, and hydrogen, for example, SiCOH or SiCO. The ultra-low k dielectric may be an aerogel or a nanopourous material. The second inter layer dielectric 112 may be a tetra ethyl ortho silicate (TEOS) layer formed by a hot mask. Other dielectric materials may be used for the inter layer dielectrics 111, 112.

In one embodiment, the probe pad 102 is formed to have columns 103 that are mechanical supports to absorb some of the compressive pressure applied when the probe tip 101 contacts the probe pad 102. In another embodiment, the columns 103 maybe electrical connections that couple the probe pad 102 to integrated circuits formed in the wafer 100.

The probe tip 101 damages the probe pad 102 as the automated testing equipment pushes the probe tip 101 into the material of the probe card. As the probe tip is pushed through the first and second inter layer dielectrics 111, 112 to contact the probe pad 102, the tip displaces the ridge 108 of the probe pad 102 and portions 116, 118 of the inter layer dielectrics 111, 112. A portion 122 of the first inter layer dielectric 111 was forced into the divot 106 by the probe tip 101.

The probe pad 102 is formed in a kerf region 128 of the wafer 100. Adjacent the kerf region 128 is a portion of a die 130. In one embodiment, a cut indicator 132 provides the manufacturer with guidance on where to slice or cut the wafer 100 to singulate the die 130. Adjacent the cut indicator 132 a crack stop 134 is formed in accordance with known techniques that will not be described in detail herein.

A plurality of voltage lines 136 are also formed within the die 130, which may all be tied to V++ or ground. In an alternative embodiment, the voltage lines 136 may each be tied to a different voltage, such as 5V, 2.5V, and 7V. The voltage lines 136 may be formed to protect the integrated circuits in the die 130 from external electrical noise. A ground line 138 may also be formed in the die 130. The area adjacent the ground line 138 may be where the integrated circuits are formed in the die 130.

Figure 6:
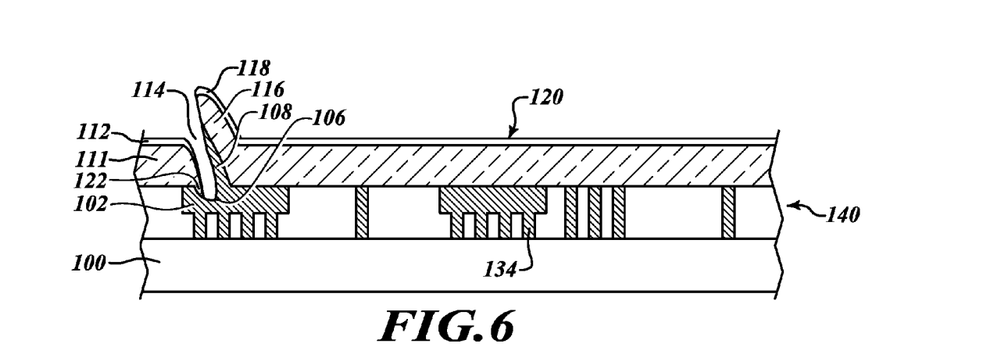

In FIG. 6, an opening 114 forms when the probe tip 101 is removed. Forming additional layers overlying the ridges 108, the divots 106, and the opening 114 can cause problems at later stages of the processing, such as under etched vias. When the probe tip is removed, the opening 114 remains in the shape of the probe tip. Moisture and other particulates can be absorbed by the first inter layer dielectric through the opening 114 if the layers are not sufficiently encapsulated. Deposition of subsequent layers traps the moisture, which can cause outgassing at later high temperature stages of processing. Outgassing occurs when moisture trapped or absorbed in a layer is turned into vapor during a later stage of the process, such as an application of heat. Voids can be created through the layers as the gas escapes to the surface 120, which may harm the circuit components.

Figure 7:
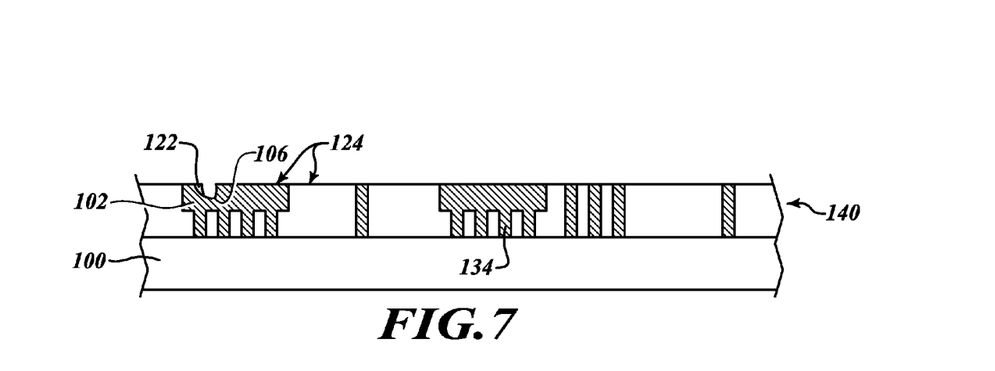

FIG. 7 shows the probe pad 102 after a chemical mechanical polish to remove the ridge 108 and the first and second inter layer dielectrics 111, 112. If the damaged probe pad 102 and the first and second inter layer dielectrics 111, 112 are not repaired, subsequent inline testing can be impacted. For example, a functioning circuit may indicate a failure because the subsequent layers did not form a good contact with the damaged probe pad 102. More particularly, damage to a pad at a previous level may indicate a die has failed, but the failure may only be related to the pad and not to the actual operation of the device.

The CMP repairs the damaged probe pad 102. A portion 122 of the first inter layer dielectric 110 that was forced into the divot 106 by the probe tip also remains in the divot 106 after the CMP. The probe pad 102 may initially be formed to have a larger height so that more of the probe pad 102 can be removed during the CMP to completely remove the divot.

The CMP may be performed immediately after the inline test or after a nitride deposition step. Comparisons of repaired pads and nonrepaired pads result in improved yields and reductions in the number of failed die per wafer. Atomic force microscope (AFM) scans of scrub marks before and after a CMP show the touch-up repair is successful in planarizing the probe pad and removing the ridge 108. Before the CMP, the AFM scan of the scrub mark shows both high protrusion by the ridge 108 and deep erosion of the divot 106. After the CMP, the AFM scan shows only shallow erosion of the remains of the divot 106.

Removing the ridge 108 with the CMP also removes parts of the conductive material of the probe pad 102 that may be broken free during the inline test. If the probe pad is made of copper and small copper particulates break free during the inline test, these particulates may cause significant problems in the final device.

Figure 8:
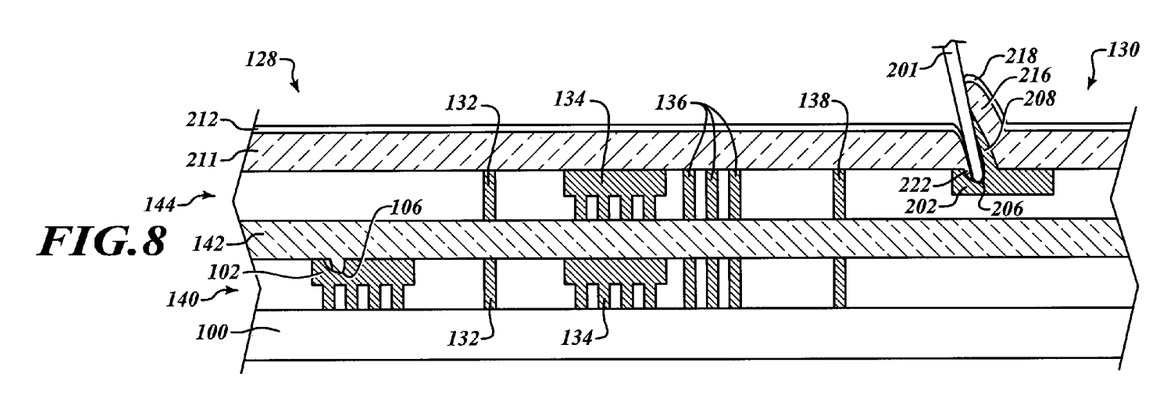

In FIG. 8, a plurality of processes are executed to form integrated circuit components integrated with the first metal level 140 and with the associated integrated circuitry below the first metal level 140. At least one dielectric layer 142 is deposited between the first metal level 140 and a second metal level 144. The at least one dielectric layer 142 is formed as the integrated circuit components are formed on the wafer 100 in the die 130.

The second metal level 144 includes the cut indicator 132 separating the kerf region 128 from the die 130. The second metal layer also includes another crack stop 134, the voltage lines 136, and the ground line 138. A second probe pad 202 is formed in the die 130 instead of in the kerf region 128. The second probe pad 202 is coupled to the integrated circuitry formed adjacent the at least on dielectric layer 142 and above the first metal layer 140 in a plane not visible in this cross-section.

The same automated test equipment may be used to probe the second probe pad 202 by using a different probe card designed for the different arrangement of the probe pads. A probe tip 201 is associated with a different probe card, but may be of the same material or of a different material than the first probe tip 101.

Inter layer dielectrics 211, 212 are deposited overlying the probe pad 202 and the other components on the wafer 100. As described above with respect to the first and second inter dielectric layers 111, 112, the inter layer dielectrics 211, 212 over the second metal level 144 may be an ultra-low k dielectric and a TEOS layer, respectively. Other dielectric materials may be used for the inter layer dielectrics 111, 112.

The probe pad 202 is damaged by the probe tip 201 as the probe tip is pushed through the inter dielectric layers 211, 212. As with the first metal level 140, the tip displaces a ridge 208 of the probe pad 202 and portions 216, 218 of the inter layer dielectrics 211, 212. A divot 206 is formed that relates to the extreme point of the tip 202. A portion 222 of the inter layer dielectric 211 may be forced into the divot 206 by the probe tip 201.

The probe pad 202 is formed as a rectangular metal contact that is coupled to the integrated circuitry in a plane not visible in the cross-section. The second probe pad 202 does not have any of the columns formed associated with the first probe pad 102.

Figure 9:
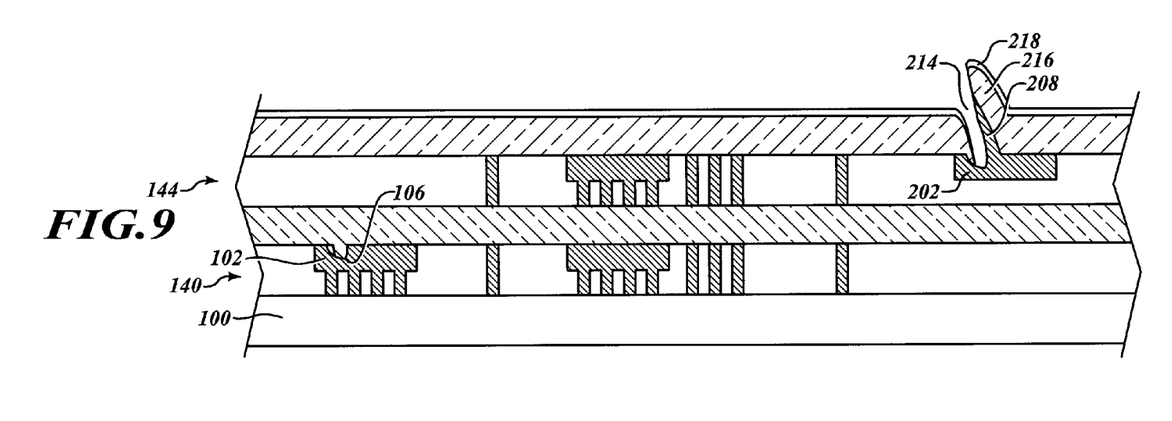

In FIG. 9, another opening 214 forms when the probe tip 201 is removed from the probe pad 202 in the second metal level 144. The ridge 208 and the portions 216, 218 of the inter dielectric layers 211, 212 are pushed upward away from the second metal layer 144.

Figure 10:
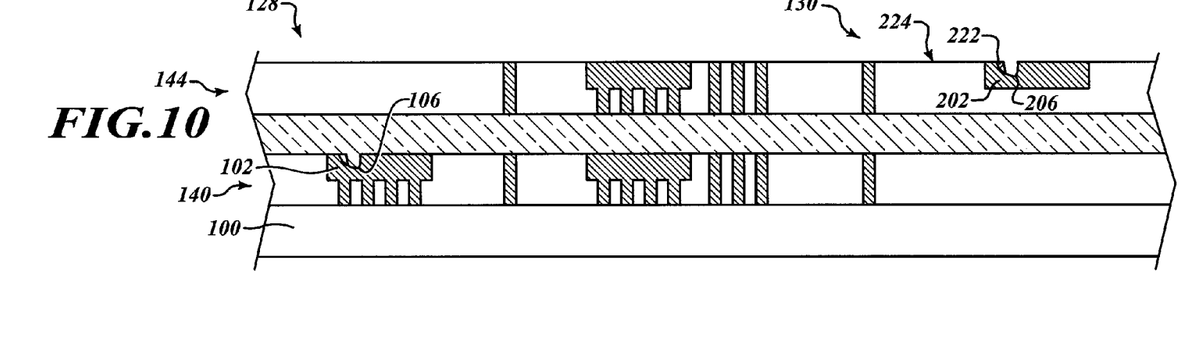

FIG. 10 shows the wafer 100 after a second CMP to repair the second probe pad 202. The ridge 208 and the portions 216, 218 of the inter layer dielectrics 211, 212 are planarized to be flush with the surface 224. The portion 222 of the inter dielectric layer 211 is forced into the divot 206 and remains after the polish. The amount of the inter dielectric layer 211 is negligible and may not affect the performance of the pad 202.

Figure 11:
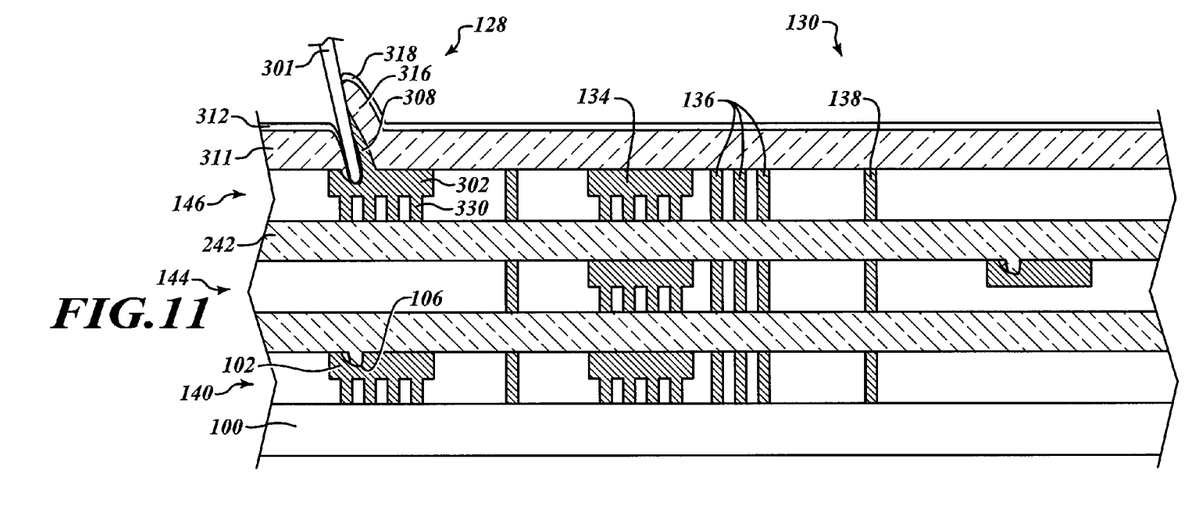
Figure 12:
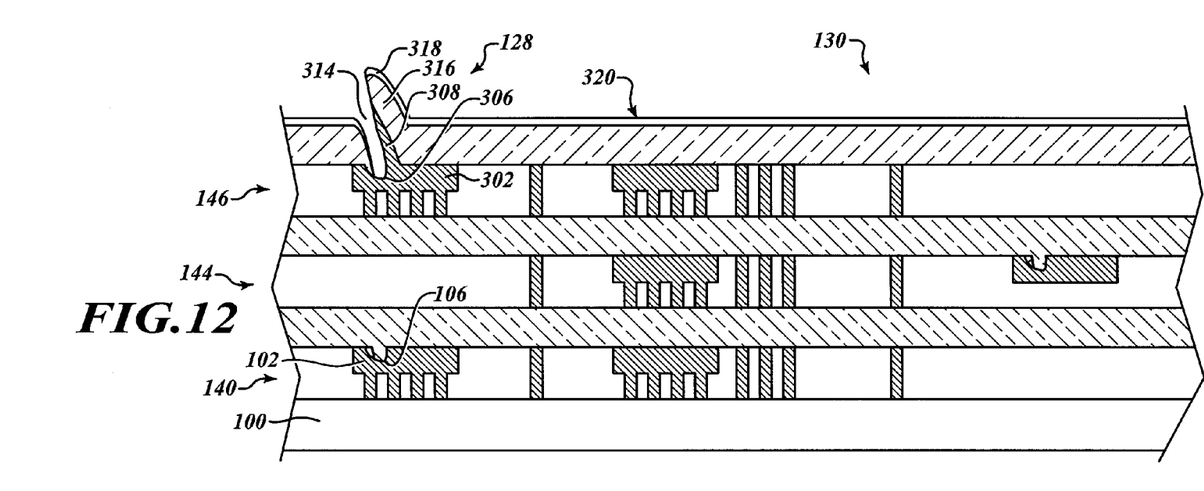
Figure 13:
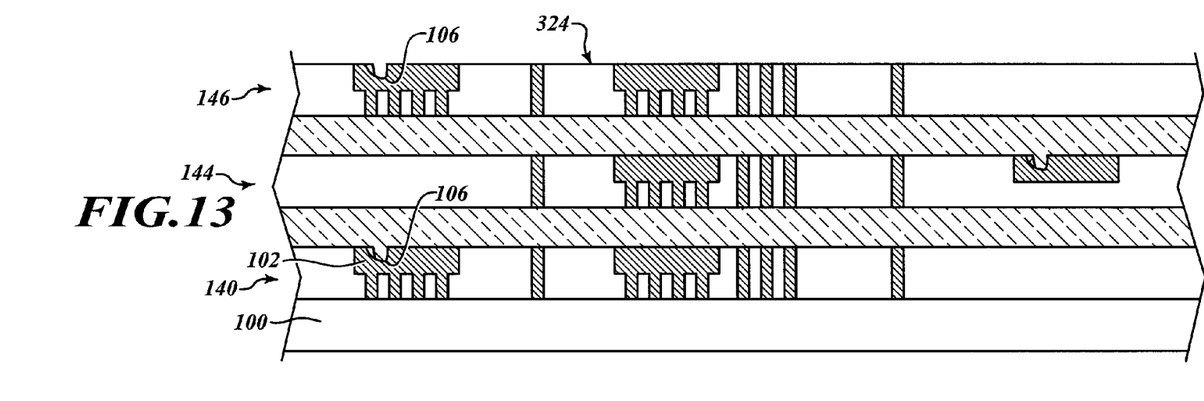

FIGS. 11-13 illustrate the formation of a third metal layer 146 having a probe pad 302 formed in the kerf 128. The probe pad 302 is also probed by a probe tip 301 to determine the functionality of the device on the wafer 100 that has the three metal layers 140, 144, and 146. The third metal layer 146 includes the features of the previous metal layers, such as the crack stop 134, the voltage lines 136, and the ground line 138.

At least one dielectric layer 242 is formed overlying the second metal layer 144 and is associated with the integrated circuitry that is formed overlying the second metal layer. A thickness of the dielectric layer 242 relates to a height of the integrated circuitry formed in the die 130 above and in communication with the second metal layer.

The probe pad 302 is formed in the kerf 128 and includes mechanical supports 330, such as the supports 130 in the probe pad 102 of the first metal layer 140. After testing is complete, the die 130 are ready for singulation. A saw or other cutting techniques are used to separate the die 130. The first and third probe pads 102, 302 will be destroyed during the dicing because they are formed in the kerf 128.

The third probe pad 302 in the third metal layer 146 is probed in a manner similar to the previous metal layers 140, 144. As with the other probe pads, the probe pad 302 is damage during inline testing by the probe tip 301. A ridge 308 of the probe pad 302 material and portions 316, 318 of inter layer dielectrics 311, 312 are displaced by the probe tip 301.

In FIG. 12, an opening 314 is formed when the probe tip 301 is removed after testing. A ridge 308 and portions 316, 318 of the inter layer dielectrics 311, 312 protrude from a surface 320 of the wafer 100.

A CMP is applied to the surface 320 of the wafer 100 to remove the protruding ridge 308 and the portions 316, 318. In FIG. 13, a top surface 324 of the third metal level 146 is planarized. This method of repairing probe pads can be repeated at each metal level, including the final metal level. The ridges formed by the probe tips affect the performance and reliability of solder ball connections as well. The planarization of the final metal level prepares probe pads for wire bonding or electrical connection to another die or wafer. Therefore, the method of the present disclosure decreases the occurrence of failures from improper or inadequate solder ball connections.

This method can be applied to all metal levels any time the wafer is damaged by a probe tip. The CMP can repair damage to all types of metal or conductive materials at all levels. Inline tests are important methods for chip manufacturers to detect defects in the wafer at early stages to avoid big losses. The method of applying a CMP to the wafer after inline testing provides manufacturers with a way to successfully test device operation without reducing the yield.

As mentioned above, inline testing is an important method used by manufacturers to detect defects in wafers at all stages of production, metal one, metal two, and metal three for example. The present method of applying a CMP to a wafer between the steps of such inline testing, as needed, provides manufacturers with a way to successfully test operation of devices during production without loss in ultimate yield. The method can be applied to all metal levels any time a wafer is damaged by a probe tip.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a first level of active circuitry formed on the substrate;
   a first metal level coupled to the first level of active circuitry, the first metal level including:
      a first probe pad having a first surface planarized by a first chemical mechanical polish, the first probe pad having a first indentation;
   a portion of a first insulating layer in the first indentation, the first insulating layer having a second surface that is coplanar with the first surface of the first probe pad, the first indentation being partially filled by the portion of the first insulating layer; and
   a second metal level coupled to the first metal level, the second metal level including:
      a second probe pad having a third surface planarized by a second chemical mechanical polish.

2. The device of claim 1 wherein the first probe pad is formed overlying the first level of active circuitry.

3. The device of claim 1 wherein the second probe pad is formed overlying the first probe pad.

4. The device of claim 1 wherein the second probe pad is formed overlying the first level of active circuitry.

5. The device of claim 1, further comprising a second insulating layer formed between the first metal level and the second metal level, a portion of the second insulating layer filling a remainder of the first indentation.

6. The device of claim 1, further comprising a second indentation in the second probe pad.

7. The device of claim 6, wherein the second indentation in the second probe pad is partially filled by a second insulating layer.

8. A device, comprising:
   a substrate;
   an integrated circuit formed on the substrate;
   a first metal layer coupled to the integrated circuit, the first metal layer having a first surface, the first metal layer including:
      a probe pad having the first surface, the probe pad including an indentation that extends below the first surface;
   a first insulating layer on the first metal layer and including a first portion positioned in the indentation of the probe pad;
   a second insulating layer, the indentation including the second insulating layer adjacent to the first portion of the first insulating layer, the second insulating layer having a second surface that is coplanar with the first surface; and a second metal layer on the first insulating layer.

9. The device of claim 8, further comprising a third insulating layer on the first metal layer, the third insulating layer having a third surface that is coplanar with a fourth surface of the second metal layer.

10. The device of claim 9 wherein the second metal layer includes a second probe pad.

11. The device of claim 10 wherein the second probe pad has a fourth surface positioned above the first surface.

12. A device, comprising:
a substrate;
an integrated circuit formed on the substrate;
a first metal layer coupled to the integrated circuit, the first metal layer having a first surface, the first metal layer including:
   a probe pad having the first surface, the probe pad including an indentation that extends below the first surface;
a first insulating layer on the first metal layer and including a first portion positioned in the indentation of the probe pad;
a second insulating layer adjacent to the first metal layer, the second insulating layer having a second surface that is coplanar with the first surface; and
a second metal layer on the first insulating layer.

* * * * *